(12) United States Patent
Mohan et al.

(10) Patent No.: US 10,249,991 B1
(45) Date of Patent: Apr. 2, 2019

(54) LOW NOISE HIGH-SPEED DATA CONNECTORS

(71) Applicant: Amazon Technologies, Inc., Seattle, WA (US)

(72) Inventors: Akshay Mohan, Santa Clara, CA (US); Jagan Vaidyanathan Rajagopalan, San Jose, CA (US); Deepak Pai Hosadurga, Santa Clara, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/638,111

(22) Filed: Jun. 29, 2017

(51) Int. Cl.
| | |
|---|---|
| H01R 13/648 | (2006.01) |
| H01R 13/6591 | (2011.01) |
| H01R 13/6477 | (2011.01) |
| H01R 13/04 | (2006.01) |
| H01R 13/46 | (2006.01) |
| H01R 13/40 | (2006.01) |
| H01R 12/52 | (2011.01) |
| H01R 13/6461 | (2011.01) |
| H01R 24/00 | (2011.01) |
| H05K 1/02 | (2006.01) |

(52) U.S. Cl.
CPC ......... *H01R 13/6591* (2013.01); *H01R 12/52* (2013.01); *H01R 13/04* (2013.01); *H01R 13/40* (2013.01); *H01R 13/46* (2013.01); *H01R 13/6477* (2013.01); *H01R 13/6461* (2013.01); *H01R 23/005* (2013.01); *H05K 1/0216* (2013.01)

(58) Field of Classification Search
None
See application file for complete search history.

(56) References Cited

U.S. PATENT DOCUMENTS

| | | | |
|---|---|---|---|
| 9,560,760 B2 * | 1/2017 | Wig | H05K 1/0216 |
| 2013/0130519 A1 * | 5/2013 | Kokkinos | H01P 1/2053 439/78 |
| 2014/0049343 A1 * | 2/2014 | Sakai | H05K 1/0225 333/219 |
| 2014/0357105 A1 * | 12/2014 | Wig | H05K 1/0216 439/81 |

* cited by examiner

*Primary Examiner* — Tho D Ta
(74) *Attorney, Agent, or Firm* — Eversheds Sutherland (US) LLP (57) ABSTRACT

High-speed data connectors having a variety of different implementations to address unwanted electromagnetic radiation and interference are described. In some instances, resonant unit structures are added within the existing connector cavity that absorb and dampen unwanted electromagnetic radiation. In other instances, resonant unit structures are added to the exterior of the connector to reduce and eliminate surface currents that can occur on the solid metal shield of the connector. In these and other instances, the resonant unit structure can be formed from a stacked structure having a resonant structure arranged in close proximity to some of the connector pins to absorb unwanted radiation from those pins. The absorbed energy is transferred to ground through other components in the stack. In still other instances, various different materials are provided to replace the conventional plastic material that is used to keep the connector pins in place and in alignment. The different materials can absorb unwanted electromagnetic radiation, and can be selected to address particular frequency ranges.

20 Claims, 6 Drawing Sheets

LOW NOISE HIGH-SPEED DATA CONNECTORS

BACKGROUND

The use of electronic devices to review digital content continues to increase on almost a daily basis. Content is of transferred using physical, direct connections via high-speed connectors that support communication protocols such as HDMI, USB, PCI Express, SATA, among others, or content is transferred wirelessly using protocols such as Wi-Fi. In addition, the speed of each of these protocols increases evolutionarily over time, such as the evolution of the Wi-Fi standard that started with transmissions at roughly 2 megahertz and has most recently been expanded to include a 5 Ghz channel to the Wi-Fi protocol. This evolution has been, at least in part, an outcome of the ever increasing resolution of the content viewed by individuals, such as the change from 720p to 1080p to the newest commercially utilized standard of 4K. While high-speed cables are designed to try to reduce the effects of noise generated during high-speed data transmissions, the effects of noise emanating from high-speed connectors can nonetheless have a negative impact on the connected devices, which then degrade the user's experience of observing content thereon. Accordingly, continuing to enhance the user's experience by further reducing noise and its negative impacts is a continuing priority.

DETAILED DESCRIPTION

The present disclosure, as set forth below, is generally directed to various embodiments of high-speed connectors that include resonant structures that reduce noise produced as artifacts from high-speed data transmissions. Such connectors may include the resonant structures located inside of the solid metal shield structure often found in such connectors. The solid metal shield can serve multiple purposes. For example, the metal shield can act to try to prevent the high frequency signals from leaking out of the cable/connector assembly, which would prevent those signals from interfering with other devices, such as Wi-Fi signals, other electronic components, etc. Another example would be to try to prevent external signals from entering the cable/connector assembly, which could cause a degradation of the digital signals being sent through the cable. In reality, however, high-speed data transmissions are inherently noisy and various unwanted signals are often radiated from the connectors regardless of the shielding, which can interfere with surrounding technology, such as wireless networks.

The interference caused by the uncontained or unmitigated noise can be particularly troublesome when the connectors are coupled to electronic devices that are, themselves transmitters, such as a wireless router, because the noise can be coupled to the wireless antenna on the device itself, which can then cause a degradation in the sensitivity of the transmitting system. For example, Amazon Fire TV devices such as the Amazon Fire TV Media Player, receive content wirelessly through a Wi-Fi connection and also includes a conventional HDMI high-speed data connector for connection to a video display or high definition television. Unwanted noise emanating from the HDMI connector can interfere with the Wi-Fi system and potentially degrade its service capability. The amount of noise experienced can also vary depending on the streaming quality of the digital content—the higher the quality, the more likely the digital signal can be negatively affected by the noise. Thus, digital signals having a format of 720 p are less likely to be affected than higher quality formats, such as 1080 p and 4K resolution.

The interference can be the result of many different factors, or combination of factors related to the high-speed signals passing through interface points, in particular, such as connectors. In general, high-speed data cables are substantially protected from both radiation of noise, and well as from external noise entering into the cables and causing a degradation of the signals therein. For example, common high-speed data cables that comply with the HDMI standard are designed with multiple layers of shielding. Many of the HDMI data signals travel through twisted pairs of wires, and each of those pairs of wires is wrapped in its own shielding, then all of the wires are often wrapped in a layer of shielding, and then the wrapped assembly is itself encased in a braided metal mesh shield (in that instance, there are three layers of shielding), prior to external rubber/plastic-based material being formed as the external surface of the cable.

Each cable, however, has two end points that are terminated in connectors, and that is where noise, if it is occurring, is likely to be found. There is the potential for many different noise-related issued to occur due to the nature of physically transitioning from a cable to one connector, then from that connector to a mating connector, and then from that mating connector on to the motherboard or graphics board within the electronic device itself. The cable-connector transition is often well taken care, through the use of 360-degree shields around the cable that are terminated within the connector. The transition from physical connector to mating connector, however, can result in impedance and/or phase mismatches that are susceptible of producing unwanted noise. It has generally been found that the faster the signals or the higher the density of the digital content, the more likely that noise will be produced. Moreover, while the discussion above and below refers to the HDMI interface in many instances, it should be understand that the embodiments described and disclosed herein are applicable to any high-speed connectors, including without limitation, HDMI, USB (such as USB 3.0), PCI (such as PCI Express of PCIe), SATA, etc.

Improved high-speed data connectors are shown in various embodiments described below and shown in the figures that include the use of one or more materials or structures that act to attenuate and/or absorb electromagnetic radiation or noise that may be emanating from the high-speed data connectors. The embodiments disclosed herein reduce or minimize the amount of electromagnetic radiation (which is referred to as the H-field versus the B-field which is magnetic flux density) produced without affecting the physical dimensions of the connectors (which are defined by various specifications). In some embodiments, a series of resonant structures are located on close proximity to high-speed connector pins within the connector body that can act to block the unwanted radiation of noise from the connector itself, in which case the surrounding technology, such as wireless networks, can avoid the negative effects of the unwanted radiation and perform more closely to the expected levels of performance.

In other embodiments, a series of resonant structures can be constructed around the connector's metal shield to further improve the shielding effectiveness while also reducing or eliminating surface currents that can occur along the solid metal surface of the shield. These resonant structures, which can be referred to as electromagnetic bandgap (EBG) structures, absorb unwanted radiation so that it does not escape from the connector, while also keeping surface currents at a minimum.

In still other embodiments, other conventional components within standard connectors can be replaced with different materials in a layered structure, which can also act to reduce noise that might otherwise be radiated from the connector. For example, in conventional high-speed HDMI cable connectors (i.e., the connector on an HDMI cable that is placed by a user into a socket-type HDMI connector typically found on an electronic device), a single low loss dielectric material, such as liquid crystal polymers having a dielectric constant on the order of 2.9, is often used to encapsulate the connector pins and to provide connection points to them. In some of the embodiments described below, the single low loss dielectric material can be replaced with a multi-layer structure which includes a layer of high permeability dielectric material having a higher dielectric constant, such as greater than 20. The layer of high permeability materials can attenuate and absorb stray, unwanted electromagnetic radiation from the connectors.

And in still other embodiments, anisotropic material is used that changes permeability based on the incoming frequency and phase of the signals. In such materials the magnetic moment of the material can vary, such that it often aligns itself the easiest way possible (which is the energetically most favorable). Thus, the materials can essentially adapt on the fly to absorb unwanted radiated electromagnetic energy, regardless of the frequency and phase of the incoming signals. Some embodiments may accomplish a reduction or minimization in radiated noise by coating the inside surface of the metal shell connector material with an electromagnetic interference absorber materials.

Figure 1:
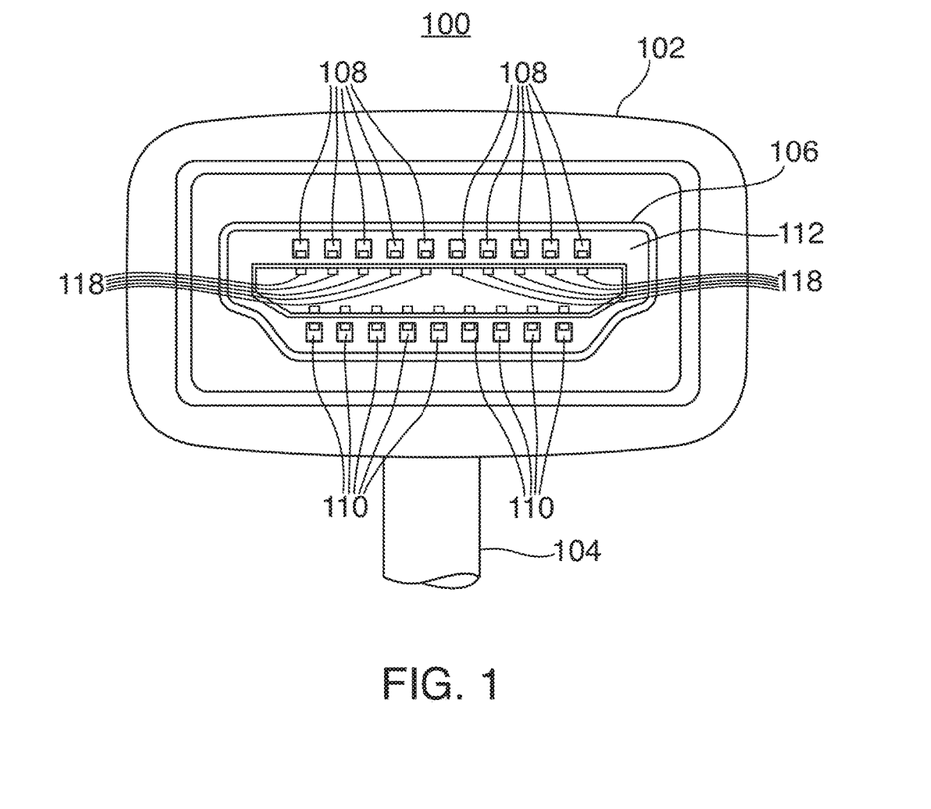
FIG. 1 is an illustrative schematic view of a conventional high-speed HDMI connector that typically may be found at one end of a conventional HDMI cable.

FIG. 1 shows an illustrative schematic view of a conventional high-speed connector 100, in this case a standard HDMI connector, which typically may be found at one end of a conventional HDMI cable 104. Connector 100 includes connector body 102, solid metal shield 106, upper pins 108, and lower pins 110. Upper pins 108 are coupled to mating pins 118, which would form electrical contacts with similarly aligned pins on the mating connector on an electronic device that connector 100 can be plugged into (lower pins 110 have a similar set of mating pins 120 for coupling to the lower set of contacts on the mating connector). All of the pins are permanently held into a fixed position by a single layer of dielectric material 112 that is formed as a rigid, solid material within metal shield 106, and which is formed into an opening to which a blade-shaped portion of a mating connector having mating pins would be inserted when connector 100 is inserted into a mating connector. In this manner, both connectors in the mating connector process have male and female components to attempt to insure that a solid and consistent mating occurs and remains between connector 100 and the connector it is mated with, without having to physically lock the connectors together, as has been done in the past (such as, for example, with a video cable connector coming from a video monitor into a computer, in which case the connector typically included hand-turned two screws that were used to temporarily fix the video cable connector to the computer).

Conventional connector 100 relies for shielding from noise in large part on solid metal shield 106, as well as the interconnection with its counterpart metal shield on the mating connector to attempt to prevent noise from being radiated during high-speed data transmissions. Unfortunately, the pair of metal shields can suffer from impedance and/or phase mismatch, as well as other potential issues, such as a misalignment in seating the two mating connectors together. In addition, the solid metal shield can carry surface currents from these and/or other sources that can also produce noise that can interfere with surrounding technology, such as an active Wi-Fi network. Accordingly, it would be beneficial to provide further shielding to high-speed connectors to prevent, reduce, and/or minimize the negative effects of noise radiation from occurring.

Figure 2:
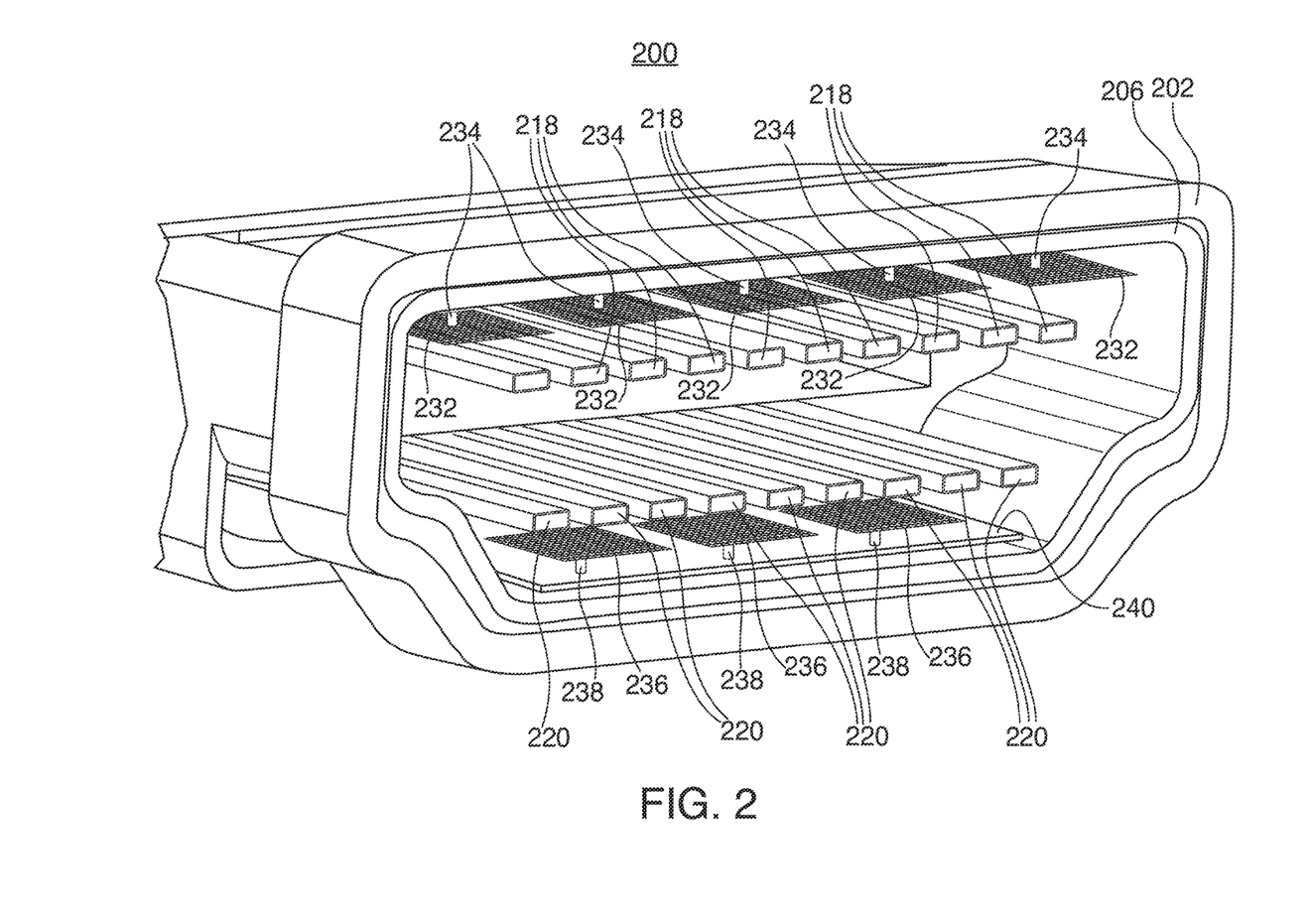
FIG. 2 is an illustrative three-dimensional schematic of a high-speed HDMI connector containing resonant structures utilized to reduce high-speed signal noise, in accordance with various embodiments.

FIG. 2 shows an illustrative three-dimensional schematic of a high-speed HDMI connector 200 containing resonant structures utilized to reduce high-speed signal noise, constructed in accordance with various embodiments. Connector 200 includes a metal shield 202, a dielectric molding 206 (only the outside edge of which is shown for illustrative purposes, as is described more fully below), upper pins 218, and lower pins 220, which are substantially similar to comparable components previously described with respect to connector 100 shown in FIG. 1. Connector 200 also includes a series of resonant units that each include a resonant structure formed within the existing physical space of the connector such that the physical dimensions of the connector remain the same. The resonant structures can act to suppress extraneous noise that would otherwise be radiated from the connector. The resonant units, as will be described in more detail in connection with FIG. 3 below, can be formed from a series of unit structures, each of which can include a resonant structure itself, and which can also include, for example, a substrate layer that can act as an insulator, a power plane, a second substrate layer, a ground plane, and a via that electrically couples the resonant structure to the ground plane (some or all of those components may be included in the unit structure).

Noise can be generated from a variety of different sources within the connector itself. For example, noise can be radiated from high-speed data transmissions going through the pins 218 and 220 from connector 200 to a mating connector (not shown). Noise can be generated from this transfer due to, among a number of reasons, impedance mismatching between the two connectors, and/or phase mismatching, or both. Noise that can be radiated from the pins may be partially blocked by the solid metal shield 202, but the energy from that radiation can also cause unwanted surface currents to appear on metal shield 202, which can then interfere with surrounding technology, such as Wi-Fi signals. At least some of the embodiments described herein utilize resonant structures that are located in close proximity to the pins to suppress noise generated without affecting the high-speed data transfer performance. The resonant structures can be installed within the pre-existing defined cavity space within the connector, such that they can be embedded within the dielectric plastic material (referred to as reference numeral 112 in HDMI connector 100 of FIG. 1, and not shown in FIG. 2 for clarity) that is used to keep all of the pins in place and in alignment within the metal casing of the connector.

The resonant structures 232 are physically held in place by the dielectric plastic material 206, which can be similar to previously described dielectric material 112 (and shown in FIG. 1), and are electrically coupled to ground through via connections 234 and 238 (as described more fully below, connections 234 and 238 can each be a via running through a substrate to a ground plane). It just depends on whether the upper structures 232 or the lower structures 236 are being referred to, in either case, an electrical connection is made from the resonant structure to ground plane 240 (the upper ground plane is aligned in a manner similar to ground plane 240—between metal shield 202 and resonant structures 232, but not shown for clarity). The two ground planes are themselves coupled to the main ground of the connector to further insure that noise radiating from connector 200, if any, is reduced or minimized. Additional components can be included within the resonant units, as is described in more detail below with respect to FIG. 3. Moreover, depending on the overall physical dimensions within metal shield 202 of connector 200, it may be desirable to provide a series of resonant units which are aligned in parallel along the length of pins 218 and 220, such that a given connector might have 2, 3, or even 4 resonant units extending from the cable rear portion of the connector to the front open portion of the connector. For example if a series of 4 resonant units were employed within connector 200 and aligned in the upper portion with pins 218, then there would be an array of 20 resonant units therein (five across and four from back to front). Regardless of the number of resonant units within a given connector, each of resonant units can be embedded within the connector dielectric material such that none of the individual components of any resonant unit, nor of the ground plane, power plane (which is described below in connection with FIG. 3), or any other component, is observable (because all such components are embedded or encapsulated within the dielectric material or whatever materials are used to hold the connector pins in place and in alignment. As noted above, a substantially solid dielectric material can be used to hold all of the pins and resonant structures (and supporting structures) in place, such as dielectric material 112 from FIG. 1, however, with regard to FIG. 2, only a small portion of the dielectric material 206 is shown so that the interaction and alignment of the resonant structures can be more easily observed. When used in commercial/consumer applications, only the pins would be visible and the resonant structures would be embedded within the dielectric material.

Figure 3:
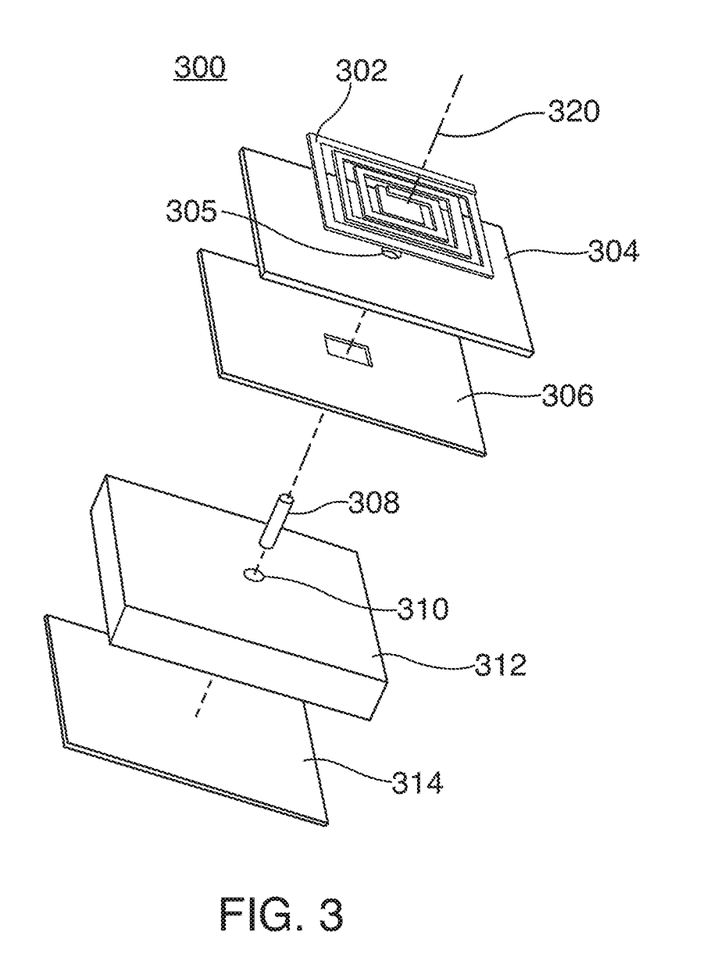
FIG. 3 is an illustrative three-dimensional exploded view schematic of a unit cell structure that includes a resonant structure utilized to reduce high-speed signal noise, in accordance with various embodiments.

FIG. 3 shows an illustrative three-dimensional exploded view schematic of a unit cell structure 300 that includes a resonant structure utilized to reduce high-speed signal noise, in accordance with various embodiments. Unit cell structure 300 includes resonant structure 302, and can include substrate 304 (which may be planar, in which case it would apply to all cell units 300 within a given upper or lower portion of a given connector), power plane 306 (which may also be planar and apply to all cell units 300 within a given upper or lower portion of a given connector), substrate 312 (which may also be planar and apply to all cell units 300 within a given upper or lower portion of a given connector), ground plane 314 (which may also be planar and apply to all cell units 300 within a given upper or lower portion of a given connector), and via 308 that electrically couples resonant structure 302 to ground plane 314. Substrate 304 includes a pass-through hole 305 through which via 308 passes to connect the center of resonant structure 302 to ground plane 314 (substrate 320 includes a similar hole 310 for via 308 to pass through). Thus, all of the components in structure 300 can be aligned along axis 320. The cell structure shown in FIG. 3 is oriented as if it were to be embedded within the lower portion of a given connector and aligned with the lower pins, such as pins 218, 220 shown in connector 200 of FIG. 2 and described above. The exact same structure could also be used with respect to the upper portion of the connector, whereby the structure would instead be aligned with pins 218 provided that the individual layers are inverted (i.e., such that ground plane 314 is on top of the structure and resonant structure 302 is located on the bottom. In that manner, the cell structure would closely resemble what is shown in FIG. 2 with respect to resonant structures 232 and vias 234. In addition, the resonant structures 302 may be employed as described herein without utilizing each and every component described in connection with FIG. 3, depending at least on how much room is available within the connector itself.

Resonant structure 302 may be formed as a solid, electrically conductive, structure, but it may be more effective at reducing and minimizing noise by being formed into a rectangular or square spiral of conductive material (as shown in FIG. 3). A spiral pattern, for example, may be more effective at reducing or minimizing noise due to the increased surface area of the structure as compared to a solid structure. For example, in addition to bottom surface and top surface that a solid structure would provide, a spiral structure also provides interior side-wall surfaces that can absorb radiated energy to help reduce, minimize and eliminate it. Given the physical dimension limitations of connectors such as connector 200 of FIG. 2, it may be useful to limit the dimensions of resonant structure 302 to something on the order of approximately a 0.2×0.2 millimeter square having a 0.1 millimeter line width and 0.1 millimeter spacing between segments of the spiral. One alternate configuration to a rectangular or square spiral may be to implement resonant structure 302 as a rectangular or square mesh formed of interwoven conductive threads, which would also provide an increased amount of exposed surface area for making contact with and absorbing radiant noise.

Resonant structure 302 can be formed in any of a number of different manners. For example, resonant structures 302 could be formed from a single, thin layer of conductive material, such as copper, that is laser cut to form the spiral-shaped component shown in FIG. 3. In another instance, substrate 304 could be an FR4 substrate (FR4 is glass-reinforced epoxy laminate sheet that is commonly utilized for printed circuit boards), and a uniform thin layer of conductive material such as copper could be formed thereon. A mask could then be created with the impressions of the resonant structures, and then the substrate could be etched, such that the only remaining conductive material on the FR4 substrate would be the spiral resonant structures. In order to improve manufacturing efficiency, single large sheets of spiral resonant structures could be etched, and then the sheets could be cut into smaller sets of resonant structures for installation in connectors. For example, one sheet of FR4 could be processed to form 100 resonant structures. The resultant sheet could then be cut into five pieces, each of which could have 20 resonant structures for use in a single connector as described above (the 5×4 array of 20 resonant structures discussed previously). There are other potential methods that could be used to form the resonant spiral-shaped structures disclosed herein, such as utilizing 3D printing, although that may not be as practical a method for large scale production projects. These are just some of the many examples that might be employed. Moreover, if the choice was made to implement the resonant structures from woven conductive threads or of conductive mesh materials, there can be many more ways to manufacture the structures.

If semiconductor/printed circuit board processing techniques are utilized, complete sets of resonant unit cell can be manufactured simultaneously. For example, each of substrates 304 and 312 could be formed from individual sheets of FR4 material. Conductive ground plane layer 314 could be deposited on the bottom side of substrate 312 using any number of different known techniques, or a thin conductive layer of material could simply be permanently affixed to the bottom side substrate 312. Substrate 312, as shown in FIG. 3, includes via 308 that passes through substrates 304 and 312 to electrically couple resonant structure 302 to ground plane 314 (it may be desirable to have via 308 aligned with the center of the resonant structure 302 as illustrated by axis 320). Power plane 306 could, in a manner similar to that just described with respect to substrate 312 and ground plane 314, be deposited on the bottom side of FR4 substrate 304. Upper substrate 304, including power plane 306 and the resonant structures 302 formed on the top surface of substrate 304, can them be installed on via 308, to form a complete layer of resonant unit cell structures, which can then be cut up into a series resonant structures as previously described.

The resonant unit cell structure can vary in size, depending on the application, and the frequency of interest that may be appearing as unwanted noise. For example, in some instances, it may be desirable to have each unit cell structure sized as a 2.5 mm×2.5 mm square, with the resonant structure occupying a 02.×0.02 millimeter square in the center of the unit cell structure. In other instances, it may be desirable for both sets of dimensions to be enlarged, while in still other instances, the both set of dimensions may be smaller.

Figure 4:
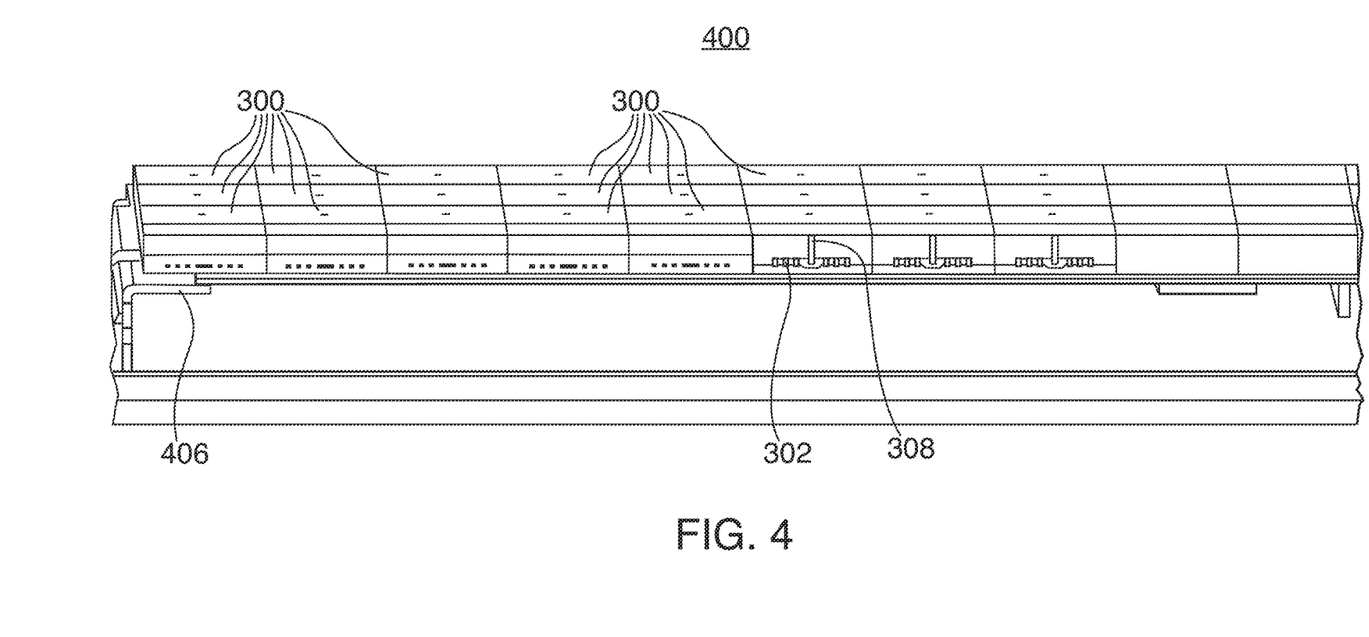
FIG. 4 is an illustrative three-dimensional schematic of portion of a high-speed HDMI connector containing resonant structures utilized to reduce high-speed signal noise, in accordance with various embodiments.

FIG. 4 shows an illustrative three-dimensional schematic of portion of a high-speed connector 400 containing resonant structures utilized to reduce high-speed signal noise, in accordance with various embodiments (connector 400 may be any high speed connector, such as HDMI, SATA, USB 3.0, PCI express, etc.). In particular, FIG. 4 shows embodiments in which shield effectiveness still may not be efficient enough, even if the embodiments described herein, such as those in shown in FIG. 2 and described above, are implemented. For example, there may be instances that are particularly noisy environments exist, such as when high-speed traces are utilized, or when there high-speed connector is coupled to, or contains itself, a particularly noisy system-on-chip (SOC) design. In such instances, the effectiveness of the shield is dependent upon the amount of isolation provided between the aggressor (e.g., the noisy SOC) and the "victim" (e.g., a local Wi-Fi signal). When there are such instances of extremely noisy environments, the effectiveness of the shielding can be very dependent upon the construction of the shield, which may include the shape and/or size of the shield, the materials used, and the frequency of interest being produced by the aggressor. Instances such as these can also result in a higher likelihood that the metal shield can end up carrying surface currents, which can further exacerbate the somewhat difficult noisy conditions that the victim has to deal with.

In order to attempt to ameliorate such harsh noisy conditions, it may be necessary to utilizes the techniques described above with respect to the interior of the connector, such as those shown in FIG. 2 where a series of resonant structures are embedded within the plastic dielectric material of the connector, while at the same time providing additional techniques to account for the surface currents that may be occurring on the external primary metal shield. In that case, the techniques shown in FIG. 2 and described above may be effective at blocking the unwanted radiation from the noisy source (e.g., a noisy SOC), and a series of similar resonant structures may be implemented on the outer surface of the metal shield to absorb unwanted surface currents. In this case, the resonant structures may be referred to as electromagnetic bandgap (EBG) structures because they tend to be directed at preventing the propagation of a particular selected bandwidth of frequencies (i.e., a bandwidth that should include the offending noisy frequencies, as well as a margin of safety on either side of those frequencies that are selected such that the EBG structures do not negatively affect the performance of the high-speed data transmissions.

FIG. 4 shows a portion of connector 400 to illustrate the implementation of a series of resonant unit structures 300 (which are shown generically for illustration purposes, but may be varied in design to account for a specific bandwidth of frequencies) are laid out in a defined pattern to minimize, reduce or prevent the occurrence of surface currents from existing on the exterior surface of metal shield 406. Resonant unit structures 300 may include specific implementations of resonant structure 302, as illustrated by the cutaway portion shown for three instances of resonant unit structure 300 in FIG. 4, each of which includes a via 308 (additional vias can be observed at the top of most of the resonant units shown in FIG. 4 for illustrative purposes). The combination of both inner and outer shielding can create essentially a "supershield" that can provide isolation for the otherwise radiated noise, while also providing dampening of the surface currents to thereby reduce and/or minimize the effects of both unwanted occurrences.

Another example of where a combined approach may be effective may be to coat the inside of the connector with electromagnetic absorbing material, while providing the external EBG components outside the shield to address the issues related to unwanted surface currents. In this instance, it may not be necessary to include the series of resonant structures in the interior of the connector, if the applied electromagnetic absorbing material can prevent the radiation of such noise, depending on the specific frequencies involved, as well as additional factors (such as, for example, impedance mismatching, etc., as described above). In other instances, it may be beneficial to implement some of the techniques described herein on one of the mating connectors, such as, for example, the use of resonant structures on the interior of the connector body for the connector attached to the high-speed data cable, while implementing the external use of EBG resonant structures on the exterior of the metal shield for the mating connector. This combination may be easier to implement given the traditional physical dimensions that exist in various high-speed data connector pairs.

Figure 5:
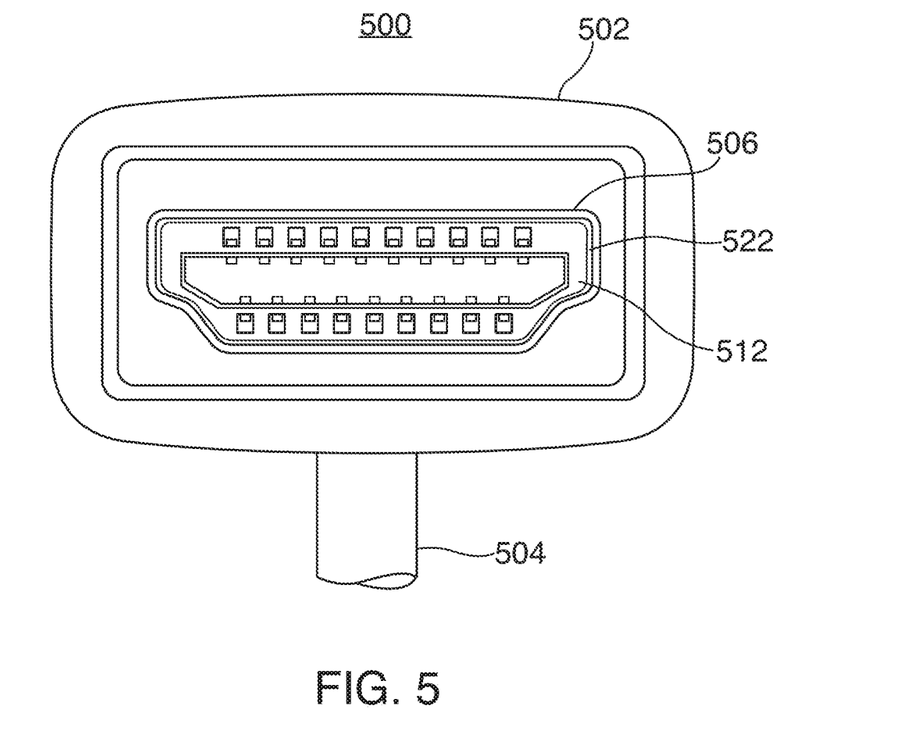
FIG. 5 is an illustrative schematic view of a high-speed HDMI connector similar to the HDMI connector shown in FIG. 1, but that has been modified to reduce the effects of radiated noise in accordance with various embodiments herein.

FIG. 5 shows an illustrative schematic view of a high-speed HDMI connector 500 that is similar to the HDMI connector shown in FIG. 1, but that has been modified to reduce the effects of radiated noise in accordance with various embodiments herein. Connector 500 includes a connector body 502, a high-speed data transmission cable 504, a metal shield 506, and dielectric material 512 that maintains the pins previously described in proper alignment within connector 500. Connector 500, while similar to connector 100 in many ways as previously described, provides additional embodiments for addressing unwanted electromagnetic radiation by varying the composition of the materials previously described as dielectric material 112 in connection with FIG. 1. In some embodiments, as shown in FIG. 5, dielectric material 112 has been replaced by a multi-layer configuration that includes dielectric material 512 (which may be substantially similar to dielectric material 112) and a second layer of material 522, which can be a material specifically designed to absorb electromagnetic radiation (such as H-field radiation). For example, second layer 522 can be formed of a high permeability dielectric material that can attenuate and absorb the electromagnetic radiation that can emanate from the connector (the dielectric material traditionally used, such as that described above with respect to dielectric material 112, is typically a low loss dielectric material, such as a liquid crystal polymer having a dielectric on the order of 2.9). The addition of a second layer 522 of high permeability material, such as a material having a dielectric constant greater than 20, can provide attenuation of electromagnetic radiation that can occur, particularly in specific spots within a connector (e.g., where the specific geometry of a given connector may create opportunities for radiation to occur, such as sharp corners where multiple surfaces of metal meet).

In other embodiments, it may be advantageous to replace dielectric material 512 and/or second layer 522 with an anisotropic material that can exhibit different propagation parameters based on the incident wave phase of the high-speed signals being transmitted and the noise generated therefrom. For example, different anisotropic materials will exhibit different permittivity and permeability that can directly affect which frequencies of signal will pass through the material and which frequencies of signal will be absorbed by the material. For example, high-speed data signals going through a connector having anisotropic material can be attenuated when such signals hit the anisotropic material, such that the high-speed data signals only end up where they are supposed to be, with extraneous signals being absorbed.

Figure 6:
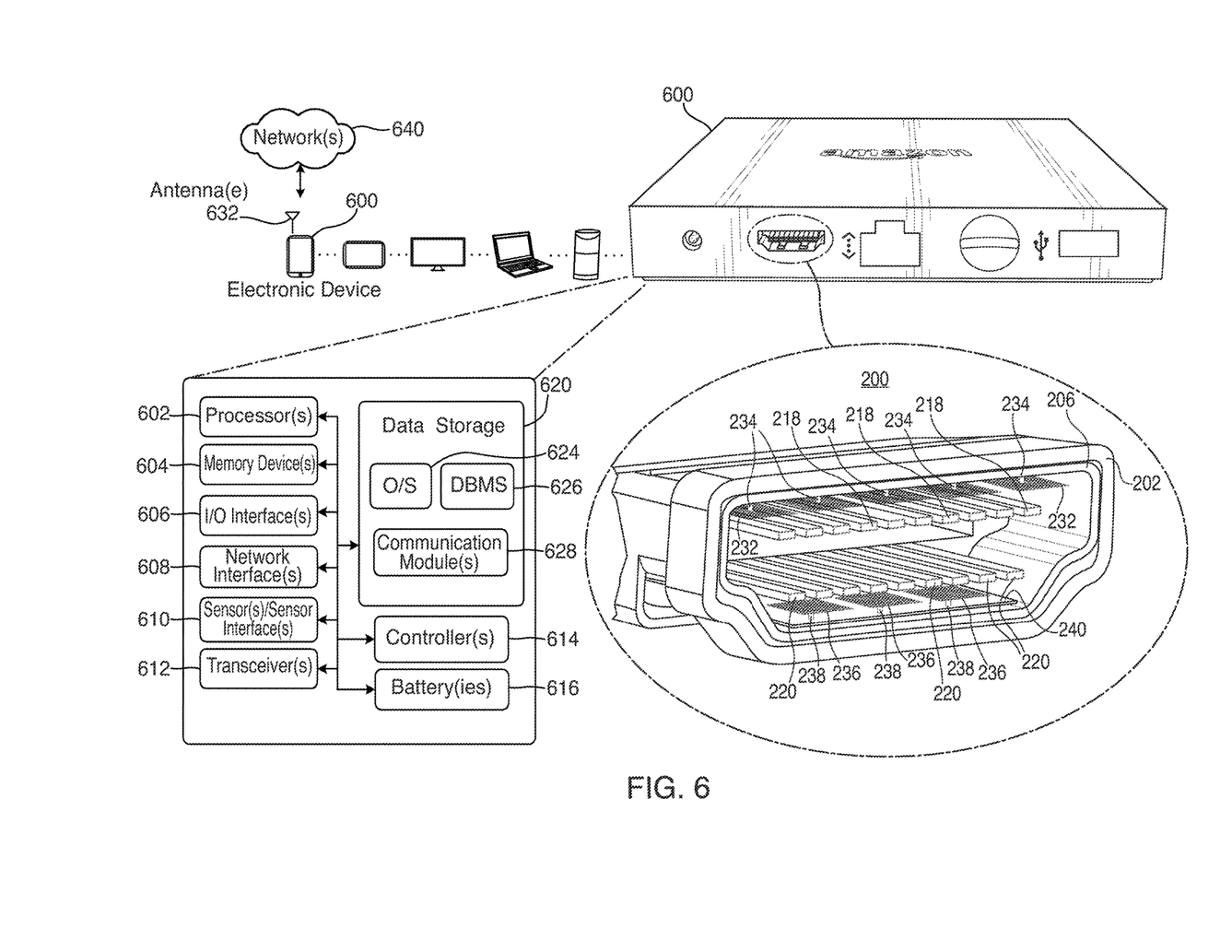
FIG. 6 is an illustrative schematic view of a portable electronic device employing at least one high speed data connector having features of various embodiments herein.

FIG. 6 shows an illustrative schematic view of a portable electronic device 600 employing at least one high speed data connector having features of various embodiments herein. Portable electronic device 600, in this instance, can be any one of a variety of devices, such as a mobile phone, a computer monitor or stand-alone video display, a laptop computer, a streaming media player, a DVD player, a video gaming system, etc.—in essence, any electronic device that could benefit from replacing standard high speed connectors with one or more of the high speed data connector techniques described herein. In FIG. 6, for example, an Amazon Fire TV media streaming player is shown having a variety of connectors, such as a power connector, an HDMI connector, an Ethernet connector, and a USB connector, as well as a slot for a micro SD card. For purposes of illustration, FIG. 6 shows device 600 having an HDMI improved connector that includes at least some of the embodiments disclosed herein, such as connector 200 shown in FIG. 2 (the connectors may be located on any side of device 600 (including the back or front), or on the edge of the display screen, or anywhere else.

While connector 200 is shown to be an HDMI connector, the techniques and embodiments disclosed herein can be applied to other high-speed data connectors, such as the USB connector shown, or other high-speed data connectors as described above. Thus, the specific model of the individual type of connector can vary without departing from the teachings of the various embodiments disclosed herein. For example, a traditional USB connector may be employed in device 600, and/or a mini-USB and/or a micro-USB connector may be employed. Similarly, a standard HDMI connector may be utilized and/or a mini-HDMI connector may be utilized. In any of these instances, as described above and throughout this disclosure, various techniques may be employed to provide more reliable and more consistent high speed data transmissions, such as through the use of resonant structures to inhibit electro-magnetic radiation from entering or exiting the connector, and/or the use of additional layers of dielectric materials within the connector itself (i.e., the plastic material used to, among other features, hold the pins in place during normal operations) that can be used to absorb electromagnetic radiation, such as H-field radiation (as described, for example, in connection with FIG. 5 above).

Connector 200, as illustrated by way of example, can be an HDMI high speed connector that can employ a series of resonant structures therein to improve high speed data transmission performance. In this example, connector 200 may be a high speed HDMI connector such as the HDMI connector shown in FIG. 2 and described above. In that case, connector 200 could include a series of resonant structures 232 and 236 that can operate to reduce the effects of unwanted electro-magnetic interference during the high speed data transmissions. The description of each of the other reference numerals described in connection with FIG. 2 applies here equally as well as will not be repeated for convenience (for clarity, some of the duplicate reference numerals from FIG. 2 have been removed in FIG. 6). Connector 200 could, alternatively, employ a configuration such as that shown by high speed data connector 400 in FIG. 4, or connector 200 could be a completely unique design that implements the high speed data transmission features of multiple embodiments disclosed herein.

In still other embodiments, it may be beneficial to wrap the connector with high permeability electromagnetic interference (EMI) material that can act as an absorbed to further reduce the unwanted effects of noise radiation. This may include, for example, applying a coating of EMI absorber material to the metal shield of the connector prior to assembly. This may also include providing an EMI absorber coating to the pins of the connector themselves, provided that the coating does not impact performance of the high-speed data transmissions.

Electronic device 600 may include a variety of circuitry such as, for example, processor(s) 602, memory 604, I/O interface(s) 606, network interface(s) 608, sensor(s)/sensor interface(s) 610, transceiver(s) 612, controller(s) 614, battery(ies) 616, data storage 620 (which may include operating system 624 and data base management system (DBMS) 626 and communication module(s) 628), antenna(s) 632, etc. Device 600 need not include each and every circuit described, and it may include additional circuitry that may be utilized for other functions and/or operations. Electronic device 600 can, through network 640, access a variety of sources of content that may include data that would typically require high-speed transfer, such as video-streaming. The high-speed data transfer would be needed to maintain the on-going playback of video content for the user without having to download and store the entire video file prior to viewing. For example, if device 600 was an Amazon Fire TV media streaming player, an Amazon customer could stream Amazon Prime original video content from Amazon to device 600 via network 640. In that instance, the streaming video could be provided from a Wi-Fi connection via antenna 632, processed by processors 602, and output to a video display via HDMI connector 200 through network interface 608. As a result of the embodiments disclosed herein, connector 200 would reduce the electro-magnetic interference that may otherwise occur, thereby improving the viewing experience by the user.

In accordance with the various embodiments described above, it may be advantageous to utilize multiple different techniques disclosed herein together to achieve a necessary reduction in radiated noise, and or a reduction or elimination of surface currents. Such reductions can prevent the otherwise noisy radiation from interfering with surrounding technology, such as a local Wi-Fi signal, or other electrical signals.

The above-described embodiments of the invention are presented for purposes of illustration and are not intended to be limiting. Although the subject matter has been described in language specific to structural feature, it is also understood that the subject matter defined in the appended claims is not necessarily limited to the specific features described. Rather, the specific feature are disclosed as illustrative forms of implementing the claims.

What is claimed is:

1. A high-speed data connector comprising:
  a metal shield;
  a plurality of pins mounted inside the metal shield;
  at least one resonant unit comprising:
    a resonant structure fixed between the metal shield and at least one of the plurality of pins and in close proximity to the at least one of the plurality of pins;
    a ground plane; and
    an electrical connection between the resonant structure and the ground plane; and
  a first dielectric material deposited within the metal shield, the first dielectric material fixing the plurality of pins in a specific orientation for mating with corresponding pins in a mating connector, the at least one resonant unit being embedded in the first dielectric material, the first dielectric material having a first permeability.

2. The high-speed data connector of claim 1, wherein the resonant unit further comprises:
  a first substrate formed of the first dielectric material, the resonant structure being mounted to a first side of the first substrate; and
  a power plane mounted to a second side of the first substrate opposite the first side.

3. The high-speed data connector of claim 2, wherein the resonant unit further comprises:
  a second substrate formed of a second dielectric material, the second substrate being mounted to the power plane on a first side of the second substrate, and having the ground plane mounted to a second side of the second substrate opposite the first side of the second substrate; and
  a via that connects the resonant structure to the ground plane.

4. The high-speed data connector of claim 1, further comprising:
  a layer of a second dielectric material located between the metal shield and the first dielectric material, the second dielectric material having a higher permeability than the first permeability.

5. A high-speed data connector comprising:
  a metal shield;
  a plurality of pins mounted inside the metal shield;
  a resonant unit located in close proximity to at least one of the plurality of pins, the resonant unit comprising:
    a resonant structure;
    a ground plane; and
    an electrical connection between the resonant structure and the ground plane; and
  a first dielectric material deposited within the metal shield, the first dielectric material fixing the plurality of pins in a specific orientation for mating with corresponding pins in a mating connector, the first dielectric material having a first permeability.

6. The high-speed data connector of claim 5, wherein the resonant unit is located between the metal shield and the at least one of the plurality of pins.

7. The high-speed data connector of claim 6, further comprising:
  a plurality of additional resonant units, each of the additional units being aligned with at least two pins of the plurality of pins.

8. The high-speed data connector of claim 7, wherein the high-speed data connector is physically compatible with High-Definition Multimedia Interface (HDMI) standard, wherein the plurality of pins comprises ten pins aligned along a first horizontal plane, and wherein the plurality of additional resonant units comprises five resonant units that are aligned in an array such that each resonant unit is aligned with two pins of the ten pins.

9. The high-speed data connector of claim 5, wherein the resonant unit further comprises:
  a first substrate, the resonant structure being affixed to a first side of the first substrate;
  a power plane affixed to a second side of the first substrate, the second side of the first substrate being opposite the first side of the first substrate;
  a second substrate having a first side of the second substrate mounted to the power plane, the second substrate having the ground plane mounted to a second side of the second substrate, the second side of the second substrate being opposite the first side of the second substrate; and
  wherein the electrical connection between the resonant structure and the ground plane is a via that connects the resonant structure to the ground plane.

10. The high-speed data connector of claim 9, further comprising:
  a layer of a second dielectric material located between the metal shield and the first dielectric material.

11. The high-speed data connector of claim 10, wherein the first dielectric material has a first dielectric constant and the second dielectric material has a dielectric constant higher than the first dielectric constant.

12. The high-speed data connector of claim 10, wherein the second dielectric material has a higher permeability than the first permeability.

13. The high-speed data connector of claim 5, further comprising:
  a layer of anisotropic material disposed between the metal shield and the first dielectric material.

14. The high-speed data connector of claim 5, wherein the resonant unit is affixed to an external surface of the metal shield.

15. The high-speed data connector of claim 14, further comprising:
- a two-dimensional array of additional resonant units affixed to the external surface of the metal shield to absorb surface currents present on the metal shield, the resonant unit being incorporated with the additional resonant units into the two-dimensional array.

16. The high-speed data connector of claim 5, further comprising:
- a coating electromagnetic interference absorber material affixed to the metal shield.

17. The high-speed data connector of claim 16, further comprising:
- a coating of electromagnetic interference absorber material affixed to the plurality of pins.

18. An electronic device comprising:
- a processor that processes video signals; and
- a high speed data connector electrically coupled to the processor, the high speed data connector comprising:
    - a resonant unit comprising electromagnetic radiation absorbing material;
    - a ground plane; and
    - an electrical connection between the resonant unit and the ground plane.

19. The electronic device of claim 18, the resonant unit further comprising:
- a first substrate, a resonant structure being affixed to a first side of the first substrate;
- a power plane affixed to a second side of the first substrate, the second side of the first substrate being opposite the first side of the first substrate;
- a second substrate having the ground plane affixed to a first side of the second substrate; and
- a via that connects the resonant structure to the ground plane.

20. The electronic device of claim 19, wherein the high speed data connector further comprises:
- a metal shield; and
- a plurality of pins, the resonant unit being mounted between the metal shield and at least one of the plurality of pins.

* * * * *